United States Patent [19]

Iwahashi

[11] Patent Number: 4,715,017
[45] Date of Patent: Dec. 22, 1987

[54] SEMICONDUCTOR MEMORY DEVICE WITH PLURAL LATCHES FOR READ OUT

[75] Inventor: Hiroshi Iwahashi, Yokohama, Japan

[73] Assignee: Kabushiki Kaisha Toshiba, Kawasaki, Japan

[21] Appl. No.: 703,435

[22] Filed: Feb. 20, 1985

[30] Foreign Application Priority Data

Feb. 21, 1984 [JP] Japan .................................. 59-30692

[51] Int. Cl.$^4$ .............................................. G11C 7/00
[52] U.S. Cl. .................................. 365/239; 365/189; 365/230
[58] Field of Search ........................ 365/230, 189, 239

[56] References Cited

U.S. PATENT DOCUMENTS

| | | | |
|---|---|---|---|
| 4,106,109 | 8/1978 | Fassbender | 365/238 |
| 4,388,621 | 6/1983 | Komatsu et al. | 340/798 |
| 4,415,994 | 11/1983 | Ive et al. | 365/189 |

OTHER PUBLICATIONS

"Memory Applications of the MNOS," Wescon Technical Papers, presented at the Western Electronic Show and Convention in Los Angeles, CA, vol. 16, pp. 4/3-1-4/3-5, Sep. 19-22, 1972.

Mattos et al., "'Nibble-Mode' Beschleunigt Speicherzugriff", Elektronik, vol. 31, No. 15 pp. 27-30, Jul. 1982.
Patent Abstracts of Japan, vol. 2, No. 127, Oct. 25, 1978, p. 7626 E 78; & JP-A-53 94 140 (Hitachi Seisakusho K.K.) 08-17-1978.

Primary Examiner—James W. Moffitt
Attorney, Agent, or Firm—Finnegan Henderson Farabow Garrett & Dunner

[57] ABSTRACT

A memory device has memory cells, first latches and second latches which latch storage data from the memory cells accessed in response to a row address signal, a read circuit for reading out the contents of the first and second latches, and a control circuit for controlling the operation of the above components. In order to increase a read rate of the memory device, the read circuit alternately reads the contents of the first latches and the second latches. While the read circuit is reading out the contents of the first latches, the second latches latch the storage data of the memory cells of the next row to be selected in response to the next address signal. While the contents of the second latches are being read out, the first latches latch the storage data of the memory cells designated by the next row address signal.

15 Claims, 20 Drawing Figures

ROW ADD.

COLUMN ADD.

F I G. 7
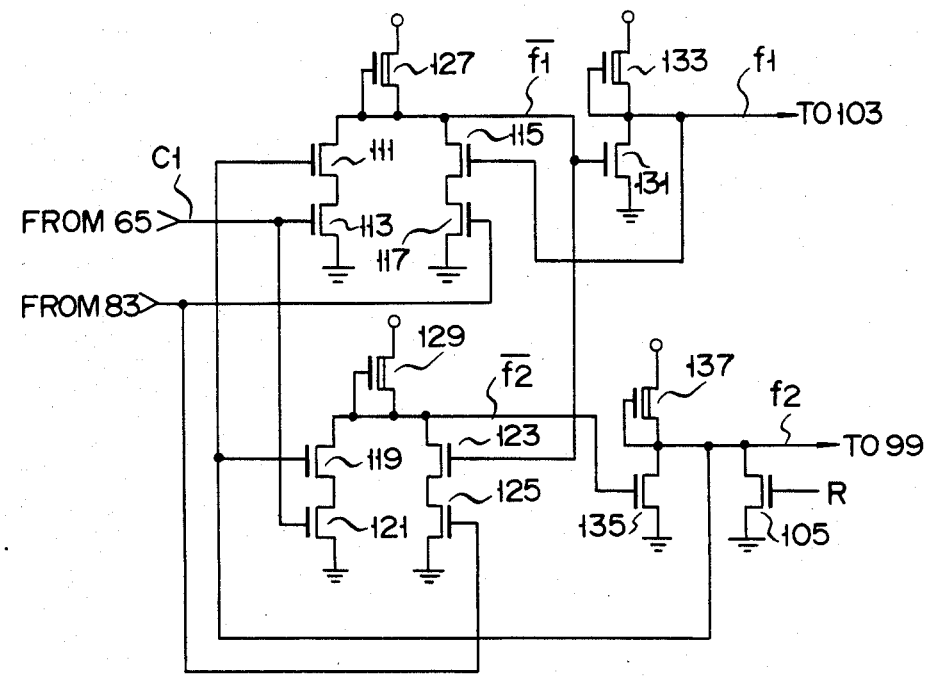
F I G. 8
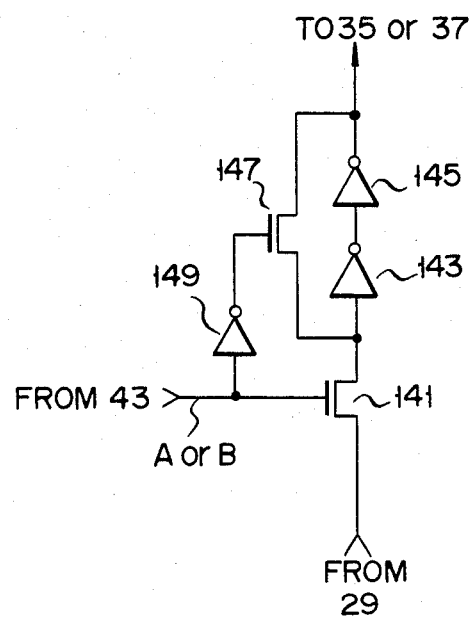

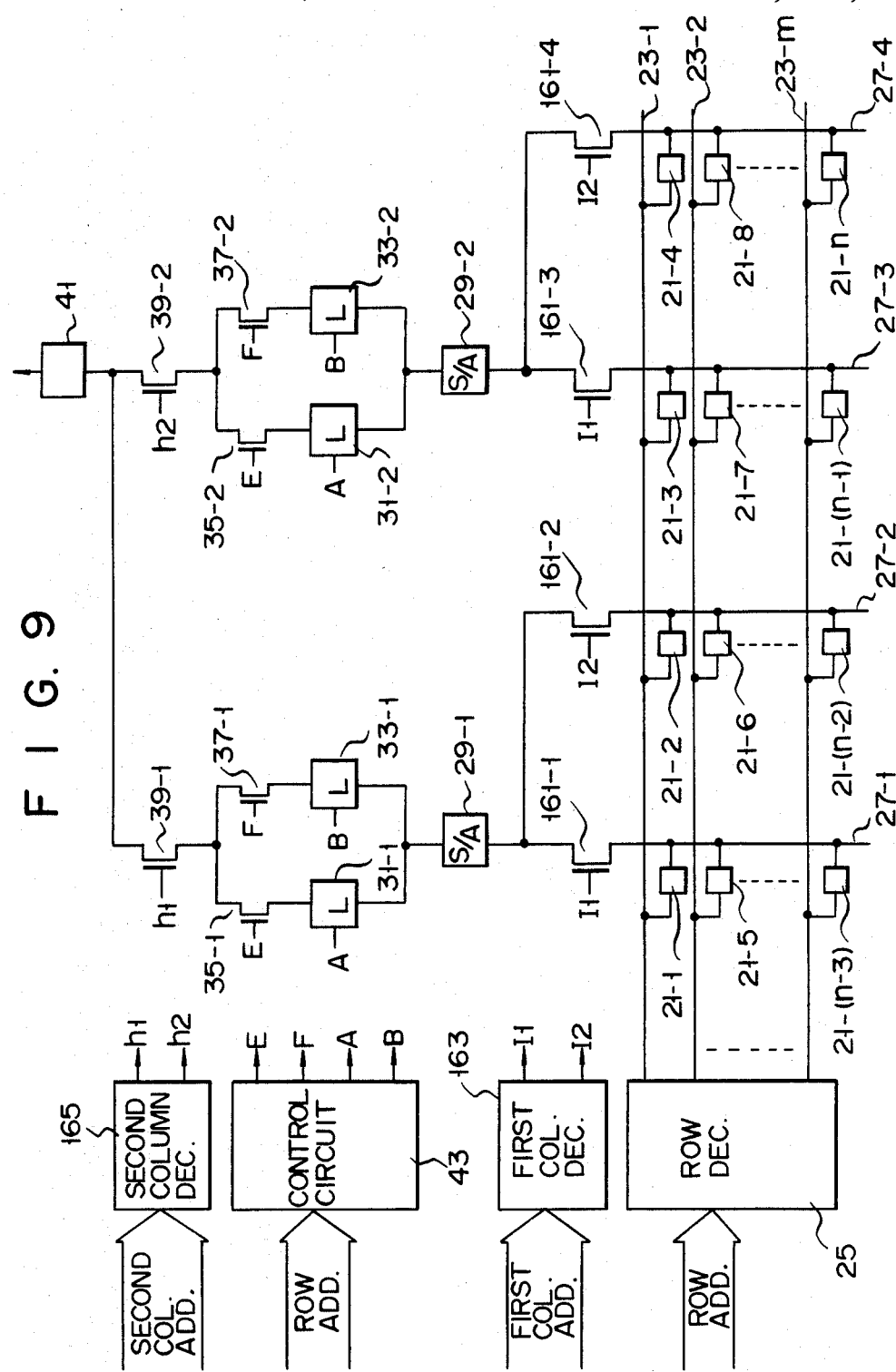

SEMICONDUCTOR MEMORY DEVICE WITH PLURAL LATCHES FOR READ OUT

BACKGROUND OF THE INVENTION

The present invention relates to a semiconductor memory device and, more particularly, to a semiconductor memory having a fast access time.

Computers such as microcomputers have developed together with the advance of semiconductor technology. There is a demand for higher processing speed of computers, and hence for more fast access time of semiconductor memories. A great amount of data is often read out from a memory under control of a CPU or the like. In this case, fast access time is preferred.

In order to achive fast access time, a conventional semiconductor memory shown in FIG. 1 is proposed. The semiconductor memory in FIG. 1 is a modified type of semiconductor memory shown in FIG. 1 of U.S. Pat. No. 4,344,156. In order to read data from the memory shown in FIG. 1 of this specification, row and column address signals are entered, and a specific memory cell is designated by these signals. A row decoder 1 decodes the row address signals and sets a corresponding word line to the active level. Output signals from memory cells 5 of the selected row are read out by sense amplifiers 7 through bit lines. Output signals from the sense amplifiers 7 are latched by latches 9. A column decoder 3 causes a transistor 11 corresponding to the column address signal to turn on. The contents of the memory cell selected by the row and column address signals are read out through an output buffer 13. The column address signal is sequentially updated to read out the contents of the other of the memory cells 5 in the row selected by row address signals. After the contents of all the memory cells of one row are read out, the row address signal is updated. Thereafter, the contents of the memory cells of the row selected in the same manner as described above are read out.

In the semiconductor memory device of FIG. 1, the word and bit lines have larger stray capacitance than other nodes. As a result, with the memory as shown in FIG. 1, a great deal of time passes forom when the row address is updated, (thus setting the word line at an active level) to when data from the memory cells reaches the latches 9 through the bit lines. Therefore, T1 (shown in FIG. 2B), which is the time necessary to read first data after every updating of the row address (shown in FIGS. 2A) in relatively long. Until the row address is again updated, however, the contents of any memory cell of the same row can be read within a short time T2 since those contents are already stored in the latches 9. The memory of FIG. 1 can thus read data faster than the known memory items of data serially read from the cells of the same row through the bit lines.

As stated in the preceding paragraphs, the memory of FIG. 1 is disadvantageous because long time T1 is required to read the first data after each updating of the row address. To reduce the time required to read data from the memory, it has been proposed that more memory cells be arranged in a row and that more latches be provided to latch the contents of these cells. These arrangements, however, do not reduce the time T1 required to read the first data every time the row address is updated. Moreover, the use of more latches inevitably increases the chip size and the cost of the memory.

SUMMARY OF THE INVENTION

It is an object of the present invention to provide a semiconductor memory device capable of reading out data at high speed.

In order to achieve the above object of the present invention, there is provided a semiconductor memory device comprising:

memory cells, arranged in a matrix form, for storing data;

latching means, connected to the memory cells, for receiving a row address signal and latching storage contents of the memory cells of a row designated by the row address signal; and reading means, connected to the latching means, for receiving a column address signal and reading out data latched by the latching means in response to the column address signal, the latching means latching storage data of the memory cells of a next row to be read out in response to the row address signal while the reading means reads out the storage contents of the latching means.

With this arrangement, the contents of the memory cells selected by the next row address signal are already latched by the latching means when the data is read out from the semiconductor memory of the present invention. Therefore, the data read time of the memory is only the time necessary to read data from the latching means. Therefore, this can shorten the data readout time as compared with the conventional memory device, wherein the word and bit lines are driven after the row address is updated, the data is latched and the latched data is then read out from the latching means. After the memory chip is selected, the access time of the first read out data is the same as that of the conventional memory device. However, thereafter, the data of the memory cells to be selected by the next row address signal are already latched by the latching means, so data is read out in a short time.

BRIEF DESCRIPTION OF THE DRAWINGS

FIGS. 5 to 8 are circuit diagrams showing the detailed arrangements of the respective parts of the semiconductor memory device shown in FIG. 3; and FIG. 9 is a circuit diagram showing the configuration of a semiconductor memory device according to another embodiment of the present invention.

DETAILED DESCRIPTION OF THE PREFERRED EMBODIMENTS

A semiconductor memory device according to an embodiment of the present invention will be described with reference to the accompanying drawings.

Figure 1:
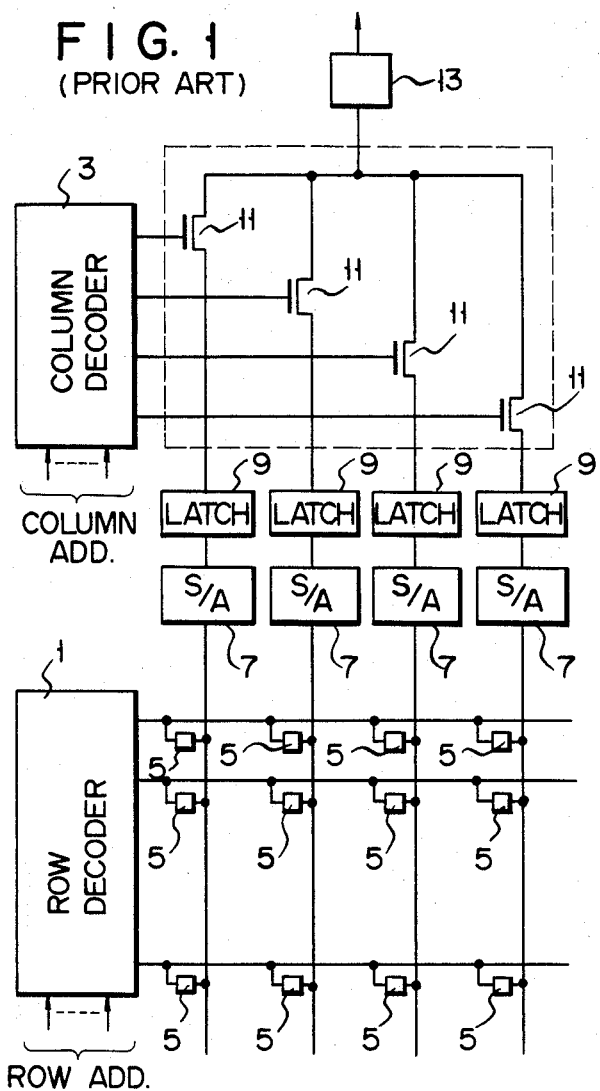
FIG. 1 is a circuit diagram of a conventional semiconductor memory device.
Figure 2A:
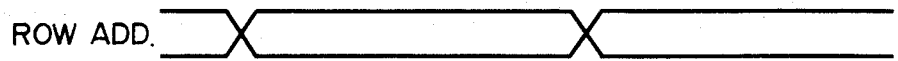
FIGS. 2A and 2B are address timing charts for explaining the operation of the semiconductor memory device shown in FIG. 1.
Figure 2B:
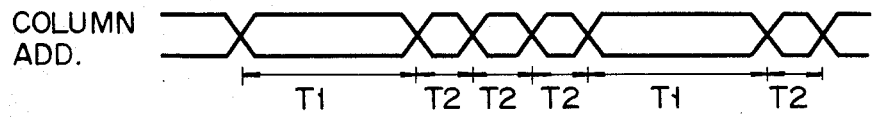
Figure 3:
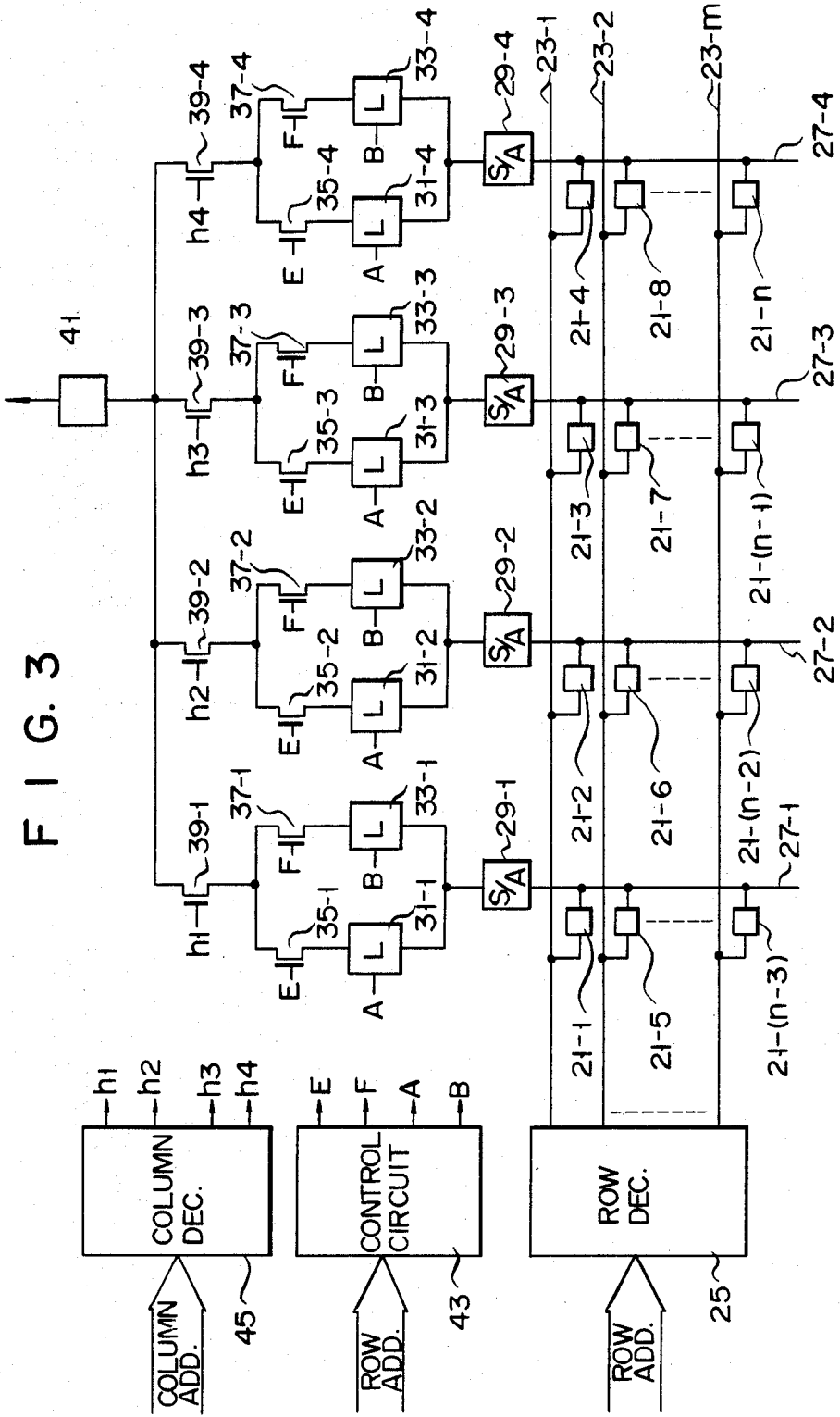
FIG. 3 is a circuit diagram showing the configuration of a semiconductor memory device according to an embodiment of the present invention.

The overall configuration of the semiconductor memory is illustrated in FIG. 3. Memory cells 21-1 to 21-n are arranged in an m×4 matrix form. A row decoder 25 is connected to the memory cells 21 through word lines 23-1 to 23-m. Sense amplifiers 29-1 to 29-4 are arranged for the respective columns. The sense amplifiers 29-1 to 29-4 are connected to the memory cells of the corresponding columns through bit lines 27-1 to 27-4. First latches 31-1 to 31-4 are connected to corresponding output terminals of the sense amplifiers 29-1 to 29-4. Similarly, second latches 33-1 to 33-4 are connected to the output terminals of the sense amplifiers 29-1 to 29-4, respectively. More particularly, the latches 31-1 and 33-1 are connected to the sense amplifier 29-1. The latches 31-2 and 33-2 are connected to the sense amplifier 29-2. The latches 31-3 and 33-3 are connected to the sense amplifier 29-3. Finally, the latches 31-4 and 33-4 are connected to the sense amplifier 29-4. One end of each of the current paths of first transfer gates 35-1 to 35-4 is connected to a corresponding output terminal of the first latches 31-1 to 31-4. Similarly, one end of each of the current paths of second transfer gates 37-1 to 37-4 is connected to a corresponding output terminal of the second latches 33-1 to 33-4.

The sources of the first and second transfer gates of the same column (i.e., the transfer gates 35-1 and 37-1, the transfer gates 35-2 and 37-2, the transfer gates 35-3 and 37-3, and the transfer gates 35-4 and 37-4) are connected. Each of the junctions of the sources of the first and second transfer gates is connected to a corresponding current path of the third transfer gates 39-1 to 39-4. The other ends of the current paths of the third transfer gates 39-1 to 39-4 are connected to each other, and a common junction is connected to the input terminal of an output buffer 41.

The first and second latches 31-1 to 31-4, and 33-1 to 33-4, and the first and second transfer gates 35-1 to 35-4 and 37-1 to 37-4 are connected to a control circuit 43. The first latches 31-1 to 31-4 are controlled in response to an output signal A from the control circuit 43. The first latches 31-1 to 31-4 perform latching when the output signal A is set at H level. The second latches 33-1 to 33-4 perform latching when an output signal B from the control circuit 43 is set at a high level. The first transfer gates 35-1 to 35-4 are controlled in response to an output signal E from the control circuit 43. Similarly, the second transfer gates 37-1 to 37-4 are controlled in response to an output signal F from the control circuit 43. A column decoder 45 is connected to the gates of the third transfer gates 39-1 to 39-4. The third transfer gates 39-1 to 39-4 are controlled in response to output signals h1 to h4 from the column decoder 45, respectively.

The operation of the memory cells shown in FIG. 3 will be described with reference to the timing charts of FIGS. 4A to 4G. In this embodiment, for simplicity, the first row memory cells 21-1, 21-2, 21-3 and 21-4, the second row memory cells 21-5, 21-6, ... are sequentially read out.

Figure 4:
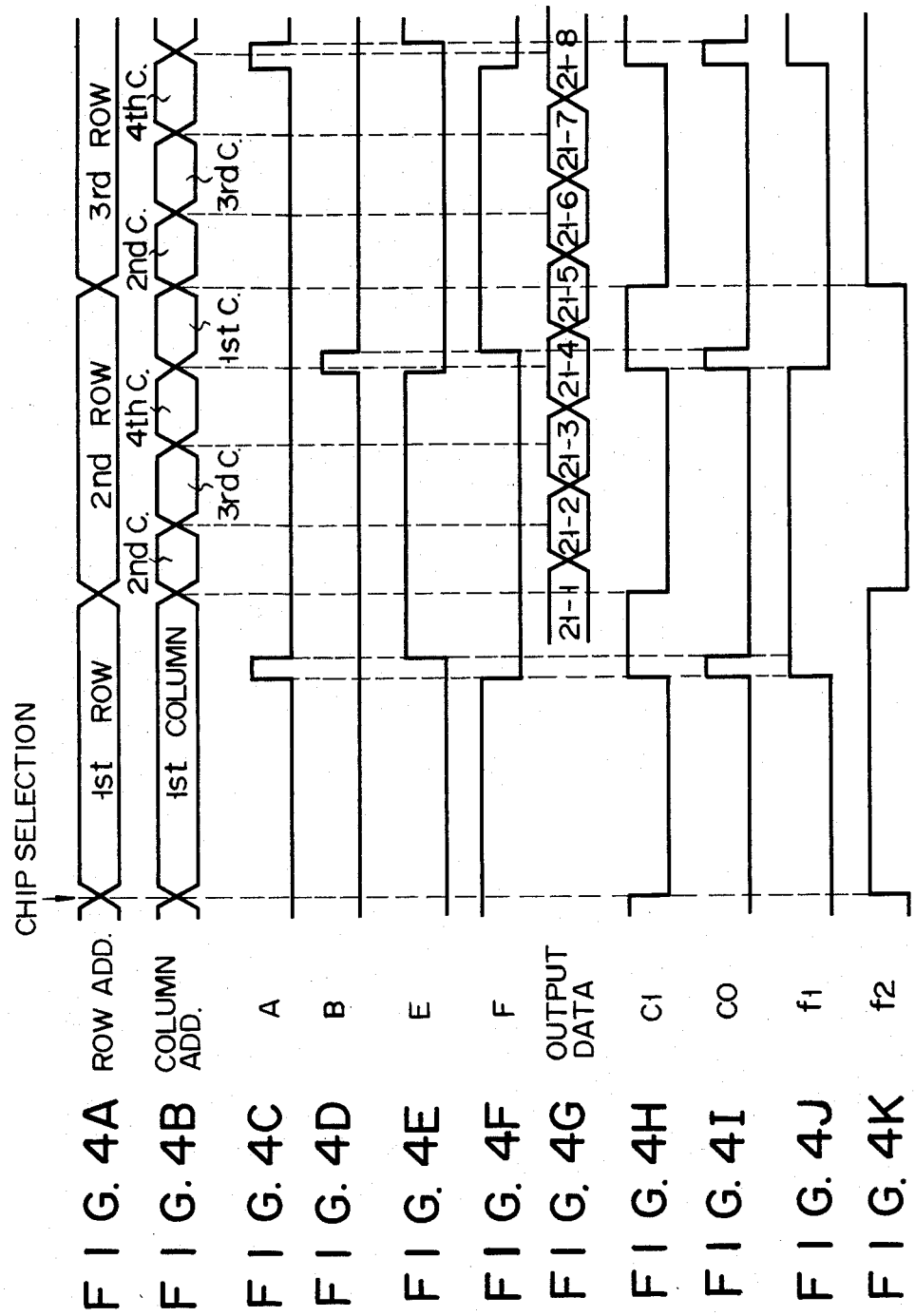
FIGS. 4A to 4K are timing charts for explaining the operation of the semiconductor memory device shown in FIG. 3.

As shown in FIGS. 4A and 4B, the row and column address signals are updated to select the memory chip and to access the memory cell 21-1. The row decoder 25 decodes the row address signal to set the word line 23-1 active. Output signals from the memory cells 21-1 to 21-4, connected to the word line 23-1, are supplied to the sense amplifiers 29-1 to 29-4 through the bit lines 27-1 to 27-4, respectively. The sense amplifiers 29-1 to 29-4 amplify input signals and generate amplified output signals.

When a predetermined period of time has elapsed after the row address signal is updated, the output signal A from the control circuit 43 goes high (FIG. 4C). This predetermined period of time is equal to or slightly longer than a time interval from a time when the row address signal is updated to read out the storage data from the memories until a time when the readout data reaches latches 31-1 to 31-4 through the bit lines 27-1 to 27-4 and the sense amplifiers 29-1 to 29-4. When the signal A is set at a high level, the storage data from the memory cells 21-1 to 21-4 are latched by the first latches 31-1 to 31-4, respectively. The output signal E from the control circuit 43 then goes high (FIG. 4E). The first transfer gates 35-1 to 35-4 are turned on, and output signals from the first latches 31-1 to 31-4 are supplied to the third transfer gates 39-1 to 39-4. The column decoder 45 decodes the column address signal and activates one of the third transfer gates 39-1 to 39-4 in response to the decoded column address signal. In this case, the third transfer gate 39-1 of the first row is turned on. The storage data of the memory cell 21-1 which is latched by the latch 31-1 is slightly delayed and read out through the output buffer 41 (FIG. 4G). When the column address signal is updated to access the second column, the column decoder 45 causes the third transfer gate 39-2 for the second column to read out the storage data of the memory cell 21-2 from the latch 31-2. Thereafter, every time the column address signal is updated, the corresponding transistor 39-3 or 39-4 is turned on, and the storage data of the memory cell 21-3 or 21-4 is read out from the latch 31-3 or 31-4 (FIG. 4G).

When the contents of the first latches 31-1 to 31-4 are read out and within the predetermined period of time after the first latches 31-1 to 31-4 perform latching, the row address signal is updated to access the next row (the second row in this case). In this embodiment, the row address is updated when the second column is updated. For this reason, the storage data of the memory cells 21-5 to 21-8, accessed by the next row address, are output onto the bit lines 27-1 to 27-4 while the storage contents of the first latches 31-1 to 31-4 are read out. During this period, the output signals from the memory cells 21-5 to 21-8 are amplified by the sense amplifiers 29-1 to 29-4 and are latched by the second latches 33-1 to 33-4, respectively.

When data read operation for the first latches 31-1 to 31-4 is completed, the control signal E goes to a low level. The control signal B from the control circuit 43 then goes to a high level. The second latches 33-1 to 33-4 latch data in response to the control signal B of high level. The storage data of the memory cells 21-5 to 21-8 of the second row are latched by the second latches 33-1 to 33-4, respectively. Subsequently, the control signal F is set at a high level, and the second transfer gates 33-1 to 33-4 are turned on (FIG. 4F). The column decoder 45 sequentially sets the signals H1 to H4 at a high level in response to the column address signal. The ON/OFF operation of the third transistors 39-1 to 39-4 is thus performed, so that the data are read out from the corresponding second latches 33-1 to 33-4. The row address signals are updated again while the data are read out from the second latches 33-1 to 33-4, and for example, the data are read out from the memory cells of the third row.

When the control signal A goes to a high level, the first latches 31-1 to 31-4 latch the storage data of the memory cells of the third row. Thus, the data from the memory cells are alternately latched by the first latches 31-1 to 31-4 and the second latches 33-1 to 33-4 every time the row address signal is updated. The data latched by the latches 31-1 to 31-4 and 33-1 to 33-4 are sequentially read out in response to the signals E, F and h1 to h4 when they are set at high level. Therefore, according to the memory device of this embodiment, it takes a long period of time after the memory chip is selected until the first output signal is generated. However, with this memory chip being still selected, data readout from the memory cells, designated by any address signal after the first address signal, requires only the time it takes for the data to be read out from the latches 31-1 to 31-4 and 33-1 to 33-4. For example, in this embodiment, it takes a long period of time to read out the storage content of the memory cell 21-1 after the memory chip is selected. However, thereafter, data can be read out in a short period of time even if the row address is updated. Therefore, unlike the conventional semiconductor memory device, it does not take a long period of time to read out the data even if the row address signal is updated. Thus, an operator is assured that data can be read out in a very short period of time.

It should be noted that the time interval (pulse width) during which the signals A and B are set at a high level should be sufficient to ensure the latching operation of the first and second latches 31-1 to 31-4 and 33-1 to 33-4. It should also be noted that the time allowed for setting the signals A and B at a high level must be sufficient beginning from a time when the row address signal is updated to read out the storage data from the first and second latches 31-1 to 31-4 and 33-1 to 33-4 received through the bit lines 27-1 to 27-4 and the sense amplifiers 29-1 to 29-4. In order to effectively operate the semiconductor memory device of this embodiment, the row address signal is updated and the next row must be activated, while the data of the memory cells of a given row are being read out. Therefore, the operator should notice that there is a period during which the memory cells selected by the address signal differs from which the data is actually being read out.

The main feature of the present invention is that data are continuously read out and the data of the memory cells of the next row to be read out is latched while the data of the memory cells of a row is being read out. However, in this embodiment, the signal B is set at a high level after the signal E is set at a low level, and signal F is set at a high level after signal B is set at a low level, for the reason that the latch time is sufficiently shorter than the read time and racing between the output signals from the first and second latches must be prevented. However, the above operation is not limited to this arrangement. It can also be executed in the following manner. For example, when the signal E is set at a high level, i.e., while the contents of the first latches are actually being read out, the signal B is set at a high level and the second latches perform the latching operation. The signals E and B are then simultaneously set at a low level. The signal F is set at a high level after the signal E is set at a low level.

In order to effectively operate the semiconductor memory device of this embodiment, when data read operation of the memory cells selected by a given row address signal is completed, it is preferable to latch the data of the memory cells to be selected by the next row address or to supply such data to the corresponding latches. Therefore, it is desirable that the following equations be satisfied:

$$TL \leq TR \times X$$

where TL is the time it takes the data is latched after the row address is updated, TR is the time it takes the latched data to be read out after the column address is updated, and X is the number of first or second latches.

In the above embodiment, a pair of first and second latches are provided for each column. However, the number of latches is not limited to two. For example, three or four latches may be provided for each column. It is essential to prelatch the storage contents of the memory cells to be accessed next.

An arrangement of the control circuit 43 for generating the signals in FIGS. 4C to 4K will be described with reference to FIGS. 5 to 8. A circuit shown in FIG. 5 constitutes part of the control circuit 43. The circuit in FIG. 5 detects updating of the row address signal and generates a signal C1 of a low level for a predetermined period of time after the row address signal is updated. A detector 51 is provided for each bit of the row address signal. When the row address signal comprises an 8-bit signal, eight detectors 51 are arranged. Each detector 51 receives a corresponding one of the eight bit signals constituting the row address signal. The bit signal received by the detector 51 is supplied to the input terminal of a first delay circuit 53, one input terminal of a NOR gate 55, and one input terminal of a NOR gate 57. An output signal from the first delay circuit 53 is supplied to the other input terminal of the NOR gate 55 and one input terminal of a NOR gate 59. An output signal from the NOR gate 55 is supplied to the other input terminal of each of the NOR gates 57 and 59. An output signal from the NOR gate 57 is supplied to one input terminal of a NOR gate 61. An output signal from the NOR gate 59 is supplied to the other input terminal of the NOR gate 61. An output signal from the NOR gate 61 is output through an inverter 63. The output signals from the detectors 51 for the respective bits of the row address signal are supplied to the corresponding input terminals of an OR gate 65.

When the logic level of the bit signal supplied to each detector 51 changes, the detector 51 generates a signal of a high level for a predetermined period of time (a delay time of the first delay circuit 53). Therefore, the OR gate 65 generates a signal C1, which become a low level for a predetermined period of time when at least one bit of the row address signal changes (FIG. 4H).

Figure 5:
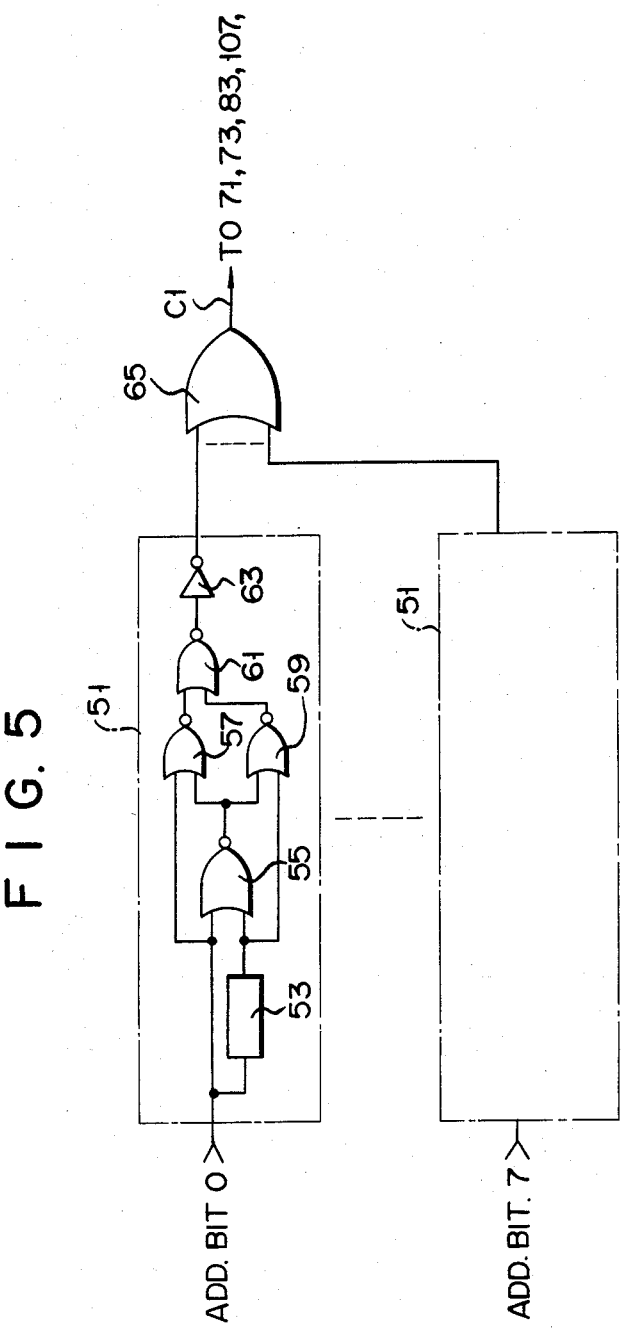
Figure 6:
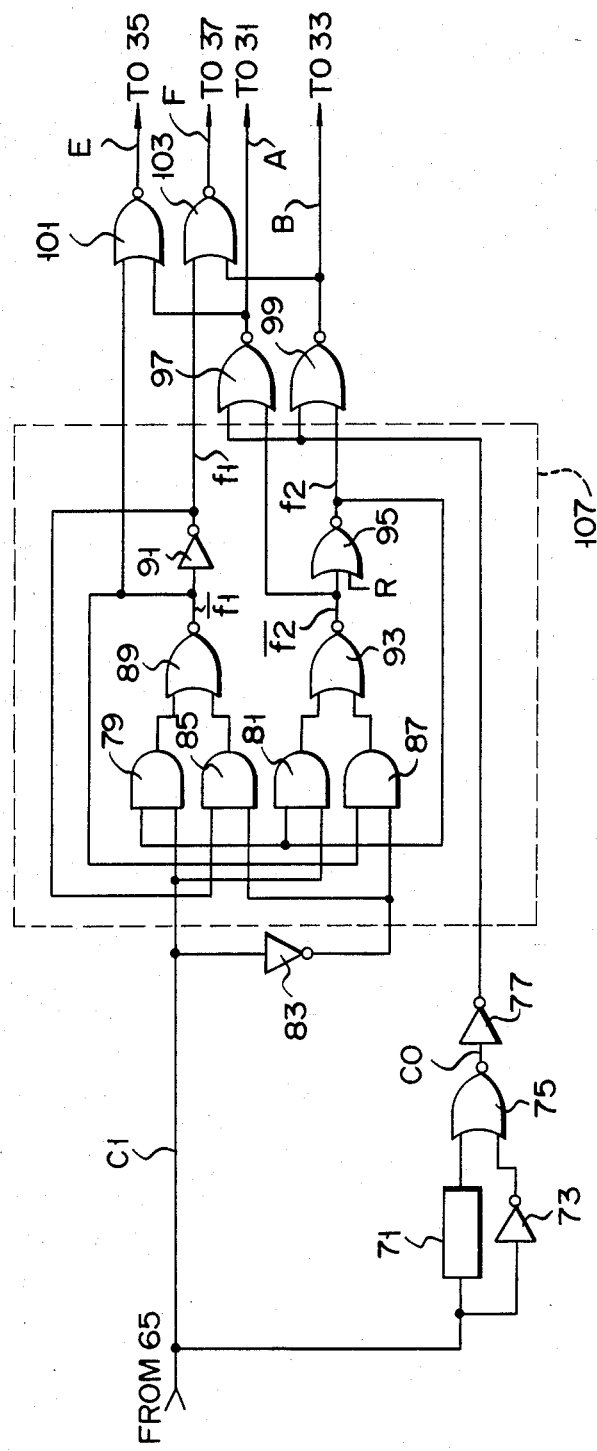

A circuit for generating the signals A, B, E and F shown in FIGS. 4C to 4F by using the output signal C1 from the circuit of FIG. 5 will now be described. Referring to FIG. 6, the signal C1 from the circuit of FIG. 5 is supplied to the input terminals of a second delay circuit 71 and an inverter 73. Output signals from the delay circuit 71 and the inverter 73 are supplied to the input terminals of a NOR gate 75. An output signal CO (FIG. 4I) from the NOR gate 75 is set at a high level for a predetermined period of time (a delay time of the second delay circuit 71) after the signal C1 is set at a high level. The signal CO from the NOR gate 75 is supplied to an inverter 77. Therefore, the inverter 77 generates a signal of a low level for a predetermined period of time after the signal C1 is set at a high level. The signal C1 is also supplied to one input terminal of each of AND gates 79 and 81 and to the input terminal of an inverter 83. An output signal from the inverter 83 is supplied to one input terminal of each of AND gates 85 and 87. Output signals from the AND gates 79 and 85 are supplied to a NOR gate 89. An output signal from the NOR gate 89 is supplied to the other input terminal of the AND gate 87 and an inverter 91. The inverter 91 generates a signal f1 (FIG. 4J). The output signal f1 from the inverter 91 is supplied to the other input terminal of the AND gate 85.

Output signals from the AND gates 81 and 87 are supplied to a NOR gate 93. An output signal from the NOR gate 93 is supplied to a NOR gate 95. The NOR gate 95 generates a signal f2 (FIG. 4K). The output signal f2 from the NOR gate 95 is supplied to the other input terminal of each of the AND gates 79 and 81.

A NOR gate 97 receives a signal $\overline{CO}$ from the inverter 77 and an output signal f2 from the NOR gate 93 and generates a NOR product of these input signals. The logically NORed signal from the NOR gate 97 is the signal A (FIG. 4C). A NOR gate 99 receives the output signal $\overline{CO}$ from the inverter 77 and the output signal $\overline{f2}$ from the inverter 95 and generates a NOR product of these input signals. The logically NORed signal from the NOR gate 99 is the signal B (FIG. 4D). A NOR gate 101 receives the output signal $\overline{f1}$ from the NOR gate 89 and the output signal A from the NOR gate 97 and generates a NOR product of these input signals. The logically NORed signal is the signal E (FIG. 4E). A NOR gate 103 receives the output signal f1 from the inverter 91 and the output signal B from the NOR gate 99 and generates a NOR product of these input signals. The logically NORed signal is the signal F (FIG. 4F).

The signal R is a reset signal which is set at a high level during a predetermined period of time beginning at power on and is supplied to the input terminal of the NOR gate 95 to initialize the circuit of FIG. 6.

The circuits shown in FIGS. 5 and 6 constitute the control circuit 43. The delay time of the first delay circuit 53 determines the time period during which the signals A and B are set at a low level after the row address is updated.

The delay provided by first circuit 53 is therefore determined to allow sufficient time for the storage contents of the memory cells to reach the first latches 31-1 to 31-4 or the second latches 33-1 to 33-4. In this circuit arrangement, the delay provided by the second delay circuit 71 determines the time period (pulse widths) during which the signals A and B are set at a high level. Therefore, the delay provided by the delay circuit 71 is determined to be the time necessary for the first latches 31-1 to 31-4 or the second latches 33-1 to 33-4 to perform latching.

The circuit for generating the signals f1 and f2 is surrounded by a dotted line 107 in FIG. 6 and is constituted by a MOS transistor arrangement as shown in FIG. 7. In the circuit shown in FIG. 7, transistors 111 and 113, transistors 115 and 117, transistors 119 and 121, and transistors 123 and 125 are connected in series with each other. The sources of the transistors 111 and 115 and the gate and drain of a depletion type MOS transistor 127 are connected together. Similarly, the sources of the transistors 119 and 123 and the gate and drain of a depletion type MOS transistor 129 are connected together. The sources of the depletion type transistors 127 and 129 are connected to a power source terminal. Junctions between the transistors 111, 115 and 127 are connected to the gates of a transistor 131 and the transistor 123. The drain of the transistor 131 is grounded, and the source thereof is connected to the gate and source of a depletion type MOS transistor 133. The source of the depletion transistor 133 is connected to the power source terminal.

A junction between the transistors 131 and 133 is connected to the gate of the transistor 115. Junctions between the transistors 119, 123 and 129 are connected to the gate of a transistor 135. The drain of the transistor 135 is grounded, and the source thereof is connected to the gate and drain of a depletion type MOS transistor 137. The source of the depletion transistor 137 is connected to the power source terminal. A junction between the transistors 135 and 137 is connected to the gates of the transistors 111 and 119.

The gates of the transistors 113 and 121 are connected to the OR gate 65 of FIG. 5 and receive the signal C1.

The gates of the transistors 117 and 125 are connected to the inverter 83 of FIG. 6 and receives an inverted signal of the signal C1. A transistor 105 acts as an initialization transistor. The signal f1 is derived at the junction between the transistors 131 and 133, and the signal f2 is derived at the junction between the transistors 135 and 137. With the arrangement in FIG. 7, the number of transistors can be greatly decreased since the NAND and NOR gates commonly use the transistors.

One embodiment of the arrangement of the first or second latches 31-1 to 31-4 or 33-1 to 33-4 of FIG. 3 is illustrated in FIG. 8. In the circuit shown in FIG. 8, one end of a current path of a transistor 141 is connected to the sense amplifier 29, and the other end thereof is connected to an inverter 143. The output terminal of the inverter 143 is connected to the input terminal of an inverter 145. The output terminal of the inverter 145 is connected to one end of a current path of a transistor 147, and the other end thereof is connected to a junction between the transistor 141 and to the inverter 143. The signal A or B from the control circuit 43 is supplied to the gate of the transistor 141 and to the input terminal of an inverter 149. The gate of the transistor 147 receives an inverted signal of the signal A or B.

In the circuit shown in FIG. 8, the transistor 141 is turned on when the signals A and B are set at a high level level which permits the input signal to pass therethrough. However, when the signal A or B is set at a low level, the transistor 141 is turned off and the transistor 147 is turned on. The output signal from the inverter 145 is supplied to the input terminal of the inverter 143. The inverters 143 and 145 are stabilized and generate the output signal from the sense amplifier 29 which is obtained immediately before the signal A or B goes low.

FIG. 9 is a circuit diagram of a semiconductor memory device according to a second embodiment of the present invention. The same reference numerals in the memory device of FIG. 9 denote the same parts as in the memory device of FIG. 3. The main feature of the semiconductor memory device of FIG. 9 is that fourth transfer gates 161-1 to 161-4 are arranged for respective bit lines 27-1 to 27-4. In addition, a sense amplifier is arranged for a predetermined number of fourth transfer gates (two in this embodiment). More particularly, transfer gates 161-1 and 161-2 are connected to the input terminal of a sense amplifier 29-1, and transfer gates 161-3 and 161-4 are connected to the input terminal of a sense amplifier 29-2. The first and second latches and the first, second and third transfer gates are arranged for each sense amplifier. More specifically, input terminals of first and second latches 31-1 and 33-1 are connected to the output terminals of the sense amplifier 29-1. One end of a current path of the first transfer gate 35-1 is connected to the output terminal of the first latch 31-1.

Similarly, one end of a current path of a second transfer gate 37-1 is connected to the output terminal of the second latch 33-1. The other end of each of the current paths of the first and second transfer gates 35-1 and 37-1 is connected to one end of a current path of a third transfer gate 39-1. Similarly, first and second latches 31-2 and 33-2 at the side of the sense amplifier 29-2 are connected to a sense amplifier 29-2.

The first and second latches 31-2 and 33-2 are connected to the first and second transfer gates 35-2 and 37-2, respectively. The first and second transfer gates 35-2 and 37-2 are connected to a third transfer gate 39-2. The other end of each of the current paths of the third transfer gates 39-1 and 39-2 is connected to the input terminal of an output buffer 41. The gates of the fourth transfer gates 161 are connected to a first column decoder 163. The first column decoder 163 decodes a first column address signal and generates corresponding signals I1 and I2. The first column decoder 163 controls the ON/OFF operation of the fourth transfer gates 161-1 to 161-4 in response to the signals I1 and I2 so as to selectively supply the signals from the bit lines 27-1 to 27-4 to the sense amplifiers 29-1 and 29-2. The third transfer gates 39-1 and 39-2 are also connected to a second column decoder 165. The second column decoder 165 decodes a second column address signal and generates signals h1 and h2. In other words, the second column decoder 165 controls the ON/OFF operation of the third transfer gates 39-1 and 39-2 in response to the second column address signal so as to selectively supply the output signals from the first and second latches to the output buffer 41.

The storage content of the memory is read out in the following manner. The row address signal is updated to access a given row, and the row decoder 25 sets the corresponding word line in the active level. The first column decoder 163 decodes the first column address signal (i.e., the signal I1 is set at a high level), and the fourth transfer gates 161-1 and 161-3 are turned on. The sense amplifiers 29-1 and 29-2 amplify the output signals from the memory cells of the first and third columns and generate the amplified output signals. Upon operation of the control circuit 43, the first latches 31-1 and 31-2 latch the transmitted data. The signal E from the control circuit 43 is set at a high level to supply the output from the first latch to the third transfer gate. The second column decoder 165 decodes the second column address signal and sequentially sets the signals h1 and h2 at a high level so as to supply the contents of the first latches 31-1 and 31-2 to the output buffer 41. While the contents of the first latches are read out, the first column decoder 163 decodes the first column address signal and then sets the signal I2 at a high level. The signal B from the control circuit 43 is set at a high level, so that the second latches 33-1 and 33-2 latch the transmitted data. When the read operation of the storage data of the first latches 31-1 and 31-2 is completed, the signal F is set at a high level so as to read out the storage contents of the second latches 33-1 and 33-2. Subsequently, the second column decoder 165 decodes the second column address signal to selectively turn on/off the third transfer gates 39-1 and 39-2. The contents of the latches 31-1 and 31-2 are sequentially read out. The row address signal is updated while the storage contents of the second latches are being read out. The contents of the memory cells of the first and third columns are latched by the first latches 31-1 and 31-2. The contents of the memory cells of the second and fourth columns are latched by the second latches 33-1 and 33-2 while the data are read out from the first latches 31-1 and 31-2. Thereafter, latching and reading are repeated. With this arrangement, the number of latches can be decreased, thus simplifying the memory construction and increasing the packing density.

One sense amplifier and a pair of latches are arranged for every two bit lines in the memory shown in FIG. 9. However, the circuit is not limited to such an arrangement. For example, one sense amplifier and a pair of latches may be arranged for every three or four bit lines. In addition, the number of latches for each sense amplifier is not limited to two, but three or four latches may be used and selectively switched.

What is claimed is:

1. A semiconductor memory device addressed by a row address signal and a column address signal and comprising:
   memory cells, arranged in a matrix of rows and columns, for storing data;
   bit lines and word lines connected to said memory cells;
   first latching means, connected to said bit lines, for latching data of said memory cells of arrow specified by the row address signal;
   second latching means, being connected to said bit lines, for latching data of said memory cells of a row specified by the row address signal;
   reading means for reading out data latched by said first latching means in response to the column address signal, and, after completion of reading of the data stored in the first latching means, for reading out data stored in the second latching means;
   whereby said second latching means latches the stored data of the memory cells of the next row to be read out in response to the row address signal while said reading means is reading out the data stored in the first latching means.

2. A device according to claim 1, wherein different ones of said first and second latching means are paired and commonly provided with sense amplifiers each connected to respective one of the bit lines for detecting the data stored in the memory cells.

3. A device according to claim 1, wherein said reading means includes
   means for reading the data from the second latching means after reading the data from the first latching means and for reading data from the first latching means after reading the data from the second latching means,
   means for causing the second latching means to latch the data stored in the memory cells of the next row to be read out while the reading means is reading out the data from the first latching means; and
   means for causing the first latching means to latch the data stored in teh meory cells of the next row to be read out while the reading means is reading out the second latching means.

4. A device according to claim 1,
   wherein said first latching means includes first latches each corresponding to a different one of said columns;
   wherein said second latching means includes second latches each corresponding to a different one of said columns; and
   wherein said reading means includes row decoder means, connected to said memory cells, for for selecting said memory cells of a row specified by the row address signal, sense amplifiers, each connected to memory cells in a corrsponding column of memory cells and to the first and second latches corresponding to those columns, for amplifying the stored data from said memory cells selected by said row decoder means, and a latch control circuit, connected to said first and second latches, for receiving the row address signal, for detecting an updating of the row address signal, and for alternately switching between said first and second latches to perform a latching operation a predetermined period of time after the row address signal is updated.

5. a device according to claim 4, wherein said reading means comprises:

first trnasfer gates, each corresponding to a different column of memory cells and having a current path connected at one end to an output terminal of said first latch of the corresponding column;

second transfer gates, each corresponding to a different column of memory gates and having a current path connected at one end to an output terminal of said second latch of the corresponding column, the other end of each of said current paths of said second transfer gates being connected to the other end of the one said first transfer gates for the same corresponding column;

third transfer gates, each corresponding to a different column of memory cells and having a current path connected at one end to a junction between the other end of said current paths of the first and second transfer gates for the same corresponding columns, the other end of said current path of each of said third transfer gates being commonly connected;

read control circuit means, connected to said first and second transfer gates, for receiving the row address signal to control conduction of said first and second transfer gates, thereby supplying output data from said first and second latches to said third transfer gates; and column decoder means, connected to said third transfer gates, for receiving and decoding the column address signal and for causing said third transfer gates of a column designated by the column address signal to conduct and supply the data transmitted through said first and second transfer gates.

6. A device according to claim 5, wherein the elements of said memory device are arranged to ensure that the product of a time required for reading out the data from said first or second latches upon updating of the column address signal and the number of pairs of said first and second latches is equal to or larger than an interval between the time when the row address signal is updated and the time when the data of data of said memory cells are accessed in response to the row address signal.

7. A device according to claim 5, wherein said row decoder means includes means for receiving an updated row address signal selected while the data of said memory cells selected by the row decoder means are read out from said first or second latches, the updated row address signal designating said memory cells of a next row to be selected.

8. A device according to claim 1, wherein said first latching means includes first latches, each corresponding to and being connected to a different one of said columns;

wherein said second latching means includes second latches, each correspoending to and being connected to a different one of said columns; and wherein said reading means includes column decoder means, connected to said memory cells, for receiving the row address signal and for selecting said memory cells specified by the row address signal, latch transfer gates, each corresponding to a different one of said columns and being connected to the memory cells in the corresponding columns, for transferring the output data of memory cells in the rows specified by said row address signal, sense amplifiers, each corresponding to and being connected to a different pair of said latch trnasfer gates and each being connected to the first and second latches corresponding to the same columns as the corresponding latch transfer gates, said sense amplifiers being arranged to amplify the data transferred from said latch transfer gates;

a latch control circuit, connected to said first and second latches, for receiving the row address signal, for detecting an updating of the row address signal, and for alternately switching between said first and second latches to perform a latching operation a predtermined period of time after the row address signal is updated; and latch decoder means for causing said latch transfer gates to selectively conduct in response to a latch coolumn address signal and for transferring the output data of said memory cells corresponding to the specified row and the latch column address signal.

9. A device according to claim 8, wherein said reading means comprises:

first transfer gates, each corresponding to a different one of the first latches and having a current path connected at one end to an output terminal of the corresponding first latch;

second trnasfer gates, each corrspnding to a different one of the second latches and to a different one of the first latches and each having a current path connected at one end to an output terminal of the corresponding second latch, the other end of said current path of each of said second transfer gates being connected to the other end of said current path of the corresponding first transfer gate;

third transfer gates, each corresponding to a different one of the sense amplifiers and having a current path connected at one end to the junction between the current paths of corresponding ones of said first transfer gates and said second transfer gates, the other end of said current path of each of said third transfer gates being commonly connected;

read control circuit means, connected to said first and second transfer gates, for receiving the row address signal, for controlling conduction of said first and second transfer gates, and for selectively supplying the signals data from said first and second latches to said third gates; and read column decoder means, connected to said third transfer gates, for decoding a read column address signal, for causing the ones of said third transfer gates designated by the read column address signal to conduct, and for transferring the signals from the third transfer gates designated by the read column address signal.

10. A semiconductor memory device addressed by a row address signal and a column address signal and comprising:
memory cells, arranged in a matrix of rows and columns, for storing data;
a row decoder, connected to said memory cells, selecting ones of said memory cells in a row of memory cells specified by the row address siganl;
sense amplifiers, each being connected to said memory cells in a different one of said columns of memory cells, for amplifying the data stored in the memory cells in said row selected by said row decoder;
a plurality of first latches, each corresponding to and being connected to an output terminal of a different one of said sense amplifiers, fro latching output data from saod sense amplifiers;
a pluraltiy of second latches, each corresponding to and being connected to an output terminal of a different one of said sense amplifiers, for latching the amplified data from said sense amplifiers;
latch cotnrol means, connected to said first and second latches, for detecting an updating of the row address signal and for switching between said first and second latches to latch said sense amplifiers' amplified data a predetermined period of time after the row address signal is updated; and
reading means, connected to said first and second latches, for reading out data latched by said first and second latches alternately in response to the column address signal,
wherein said latch control means latches the data of the memory cells in the next column to be read into said second latches while said reading means is reading data from said first latches, and wherein said latch control means latches the data of the memory cells in the next column to be read into said first latches while said reading means is reading data from said second latches.

11. A device according to claim 10, wherein said reading means comprises:
first transfer gates, each corresponding to a differnet column of memory cells and having a current path connected at one end to an output terminal of said one first latch connected to the sense amplifier of the corresponding column of memory cells;
second transfer gates, each corresponding to a different column of memory cells and having a current path connected at one end to an output terminal of said one second latch connected to the sense amplifier of the corresponding column of memory cells, the other end of each of said current paths of said second transfer gates being connected to the other end of said current paths of said first transfer gate for the corresponding column;
third transfer gates, each corresponding to a different column of memory cells and having a current path connected at one end to a junction between the other ends of said current paths of the first and second transfer gates for the corresponding columns, the other end of said current path of each of said third transfer gates being commonly connected;
a read ccontrol circuit, connected to said first and second transfer gates, for receiving the row address signal to control conduction of said first and second transfer gates, thereby selectively supplying output data from said first and second latchs to said third transfer gates; and
a column decoder, connected to said third transfer gates, for receiving and decoding the column address signal and for causing said third transfer gates of a column designated by the column address signal to conduct and supply the data transmitted through said first and second transfer gates.

12. A device according to claim 11, wherein the elements of said memory device are arranged to ensure that the product of a time required for reading out the data from said first or second latches upon updating of the column address signal and the number of pairs of said first and second latches is equal to or larger than an interval between the time when the row address signal is updated and the time when the data of said memory cells accessed in response to the row address signal.

13. A device according to claim 11, wherein said row decoder includes means for receiving an updated row address signal while the data of said memory cells specifed by the row address signal are read out from said first or second latches, the updated row address signal designating memory cells of a next row to be selected.

14. A semiconductor memory device addressed by a row address signal and a lathc column address signal and comprising:
memory cells, arranged in a matrix of rows and columns, for storing data;
a row decoder, connected to said memory cells, for selecting ones of said memory cells in a row of memory cells specified by the row address signal;
a plurality of latch transfer gates, each being connected to said memory cells in a different one of said columns, for transferring the output data of said memory cells in the row selected by said row decoder;
a plurality of sense amplifiers, each connected to a different pair of said latch transfer gates, to amplify the data transferred from said latch transfer gates;
a plurality of first latches, each connected to a different one of said sense amplifiers, for latching the amplified data from that sense amplifier;
a plurality of second latches, each connected to a different one of said sense amplifiers, for latching the amplified data from that sense amplifier;
a latch control means, connected to said first and second latches, for detecting updataing of the row address signal and for switching between, said first and second latches to latch said sense amplifiers' output data a predetermined period of time after the row address signal is updated; and
latch decoder for causing said latch transfer gates to conduct in response to the latch column address signal and for transferring the output data of said memory cells in the specified row and in the column specified by the latch column address signals; and
reading means, conencted to said first and second latches for alternately reading out data latched by said first and second latches in response to the latch column address signal,
wherein said latch control means latches the data of the memory cells in the next column to be read into said second latches while said reading means is reading data from said first latches, and wherein said latch control means latches the data of the memoryu cells in the next column to be read into said first latches while said reading means is reading data from said second latches.

15. A device according to claim 14, wherein said reading means comprises:
- first transfer gates, each corresponding to a different first latch and having a current path connected at one end to an output terminal of the corresponding first latch;
- second transfer gates, each corresponding to a different second latch and having a current path connected at one end to an output terminal of said corresponding second latch, the other end of said current path of each of said second transfer gates being connected to the other end of said current path of the first transfer gate conencted to the same sense amplifier;
- third transfer gates, each corresponding to a different sense amplifier and having a current path connected at one end to a junction between the current paths of the one of said first transfer gates and the one of said second second transfer gates connected to the sense amplifier corresponding to that third transfer gate, the other end of said current path of each of said third transfer gates being commonly connected;
- a read control circuit, connected to said first and second transfer gates, for receiving the row address signal, for controlling conduction of said first and second transfer gates, and for selectively supplying the output data from said first and second latches to said third transfer gates; and
- a read column decoder, connected to said third transfer gates, for receiving and decoding the latch column address signal, thereby causing ones of said third trnasfer gates designated by the latch column address signal to conduct and transfer the output data from the memory cells identified by the read column address signal which is selected from the output data of said first and second latches.

* * * * *

UNITED STATES PATENT AND TRADEMARK OFFICE
CERTIFICATE OF CORRECTION

PATENT NO. : 4,715,017
DATED : December 22, 1987
INVENTOR(S) : Hiroshi IWAHASHI

It is certified that error appears in the above-identified patent and that said Letters Patent is hereby corrected as shown below:

In Claim 3, Column 10, Line 58; change "teh" to --the--.

In Claim 4, Column 11, Line 5; change "corrsponding" to --corresponding--.

In Claim 5, Column 11, Line 17; change "a" to --A--.

UNITED STATES PATENT AND TRADEMARK OFFICE
CERTIFICATE OF CORRECTION

PATENT NO. : 4,715,017
DATED : December 22, 1987
INVENTOR(S) : Hiroshi IWAHASHI

It is certified that error appears in the above-identified patent and that said Letters Patent is hereby corrected as shown below:

In Claim 5, Column 11, Line 19; change "trnasfer" to --transfer--.

In Claim 8, Column 12, Line 5; change "correspoending" to corresponding--.

In Claim 8, Column 12, Line 18; change "trnasfer" to --transfer--.

In Claim 8, Column 12, Line 29; change "predtermined" to --predetermined--.

UNITED STATES PATENT AND TRADEMARK OFFICE
CERTIFICATE OF CORRECTION

PATENT NO. : 4,715,017
DATED : December 22, 1987
INVENTOR(S) : Hiroshi IWAHASHI

It is certified that error appears in the above-identified patent and that said Letters Patent is hereby corrected as shown below:

In Claim 8, Column 12, Line 33; change "coolumn" to --column--.

In Claim 9, Column 12, Line 43; change "corrspnding" to --corresponding--.

In Claim 9, Column 12, Line 43; change "trnasfer" to --transfer--.

In Claim 10, Column 13, Line 10; change "siganl" to --signal--.

In Claim 10, Column 13, Line 19; change "saod" to --said--.

UNITED STATES PATENT AND TRADEMARK OFFICE
CERTIFICATE OF CORRECTION

PATENT NO. : 4,715,017

DATED : December 22, 1987

INVENTOR(S) : Hiroshi IWAHASHI

It is certified that error appears in the above-identified patent and that said Letters Patent is hereby corrected as shown below:

In Claim 11, Column 13, Line 18; change "fro" to --for--.

In Claim 11, Column 13, Line 44; change "differnet" to --different--.

In Claim 13, Column 14, Line 22; change "specifed" to --specified--.

In Claim 14, Column 14, Line 48; change "updataing" to --updating--.

UNITED STATES PATENT AND TRADEMARK OFFICE
CERTIFICATE OF CORRECTION

PATENT NO. :     4,715,017

DATED       :     December 22, 1987

INVENTOR(S) :    Hiroshi IWAHASHI

It is certified that error appears in the above-identified patent and that said Letters Patent is hereby corrected as shown below:

In Claim 14, Column 14, Line 68; change "memoryu" to --memory--.

In Claim 14, Column 14, Line 26; change "lathc" to --latch--.

In Claim 15, Column 15, Line 15; change "conencted" to --connected--.

In Claim 15, Column 16, Line 15; change "trnasfer" to --transfer--.

Signed and Sealed this

Eighteenth Day of October, 1988

*Attest:*

DONALD J. QUIGG

*Attesting Officer*    *Commissioner of Patents and Trademarks*